United States Patent
Zhuang et al.

(10) Patent No.: US 6,457,479 B1
(45) Date of Patent: Oct. 1, 2002

(54) METHOD OF METAL OXIDE THIN FILM CLEANING

(75) Inventors: Wei-Wei Zhuang, Vancouver, WA (US); Fengyan Zhang, Vancouver, WA (US); Sheng Teng Hsu, Camas, WA (US); Tingkai Li, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/965,581

(22) Filed: Sep. 26, 2001

(51) Int. Cl.$^7$ ................................................ B08B 6/00
(52) U.S. Cl. ...................... 134/1.3; 134/1.1; 134/1; 134/1.2; 134/2; 134/21; 134/25.5; 134/26; 134/32; 134/34; 134/36; 134/902
(58) Field of Search .................... 134/1.1, 1, 1.2, 134/1.3, 2, 21, 15.2, 26, 32, 34, 36, 902

(56) References Cited

U.S. PATENT DOCUMENTS

| | | | | |
|---|---|---|---|---|
| 5,731,634 A | * | 3/1998 | Matsuo et al. | 257/751 |
| 5,759,751 A | * | 6/1998 | Shimizu et al. | 430/256 |
| 5,911,837 A | * | 6/1999 | Matthews | 134/2 |
| 6,004,886 A | * | 12/1999 | Houng et al. | 438/778 |
| 6,030,754 A | * | 2/2000 | Atnip | 134/1.2 |
| 6,045,624 A | * | 4/2000 | Kamikawa et al. | 134/21 |
| 6,105,588 A | * | 8/2000 | Li et al. | 134/1.1 |
| 6,107,202 A | * | 8/2000 | Chiu et al. | 438/120 |
| 6,372,410 B1 | * | 4/2002 | Ikemoto et al. | 430/313 |

* cited by examiner

Primary Examiner—Sharidan Carrillo
(74) Attorney, Agent, or Firm—David C. Ripma; Matthew D. Rabdau; Scott C. Krieger

(57) ABSTRACT

A method of cleaning a metal oxide thin film on a silicon wafer, includes dipping the wafer in an organic solvent; drying the wafer in a nitrogen atmosphere; and stripping any photoresist from the wafer in an oxygen atmosphere under partial vacuum at a temperature of about 200° C. The wafer may also be cleaned by dipping in a polar organic solvent and subjecting the wafer to ultrasound while immersed in the solvent.

1 Claim, 8 Drawing Sheets

PGO PATTERN WAFERS AFTER PT DRY ETCHING

↓

DIPPED INTO POLAR ORGANIC SOLVENTS
ULTRASONICALLY CLEANED FOR 10-40 MINUTES

↓

DRIED UNDER PURE NITROGEN GAS FLOW

↓

PHOTORESIST STRIPPED UNDER VACUUM IN
OXYGEN ENVIRONMENT AT 200°C

↓

DIPPED INTO POLAR ORGANIC SOLVENTS
ULTRASONICALLY CLEANED AGAIN FOR 5-20 MINUTES

↓

SEM

METHOD OF METAL OXIDE THIN FILM CLEANING

FIELD OF THE INVENTION

This invention relates to a method of metal oxide thin film cleaning using organic solvents to remove platinum chloride residue after dry etching of a platinum electrode.

BACKGROUND OF THE INVENTION

Metal oxide thin films have a broad applications in ferroelectric and semiconductor devices. Platinum metal thin film is a commonly used material for the a device electrode. During device fabrication, the platinum metal thin film is subject to etching processes to form device patterns on silicon wafers. The best technique for platinum etching is a dry etching process, using chlorine-containing gases. During dry etching, the chlorine-containing gases react with the platinum metal to form non-volatile platinum-chloride-containing compounds, which removes platinum, but which leaves the platinum-chloride-containing compounds on other portions of the structure, or forms a fence along a photoresist side wall. Because these platinum-chloride-containing etching products are not volatile, they cannot be removed by a dynamic vacuum system. Wafer cleaning is necessary to remove the platinum-chloride-containing etching by-products from patterned metal oxide thin films.

SUMMARY OF THE INVENTION

A method of cleaning a metal oxide thin film on a silicon wafer, includes, in a first embodiment, dipping the wafer in an organic solvent, such as tetrahydrofuran for about 12 hours; drying the wafer in a nitrogen atmosphere; and stripping any photoresist from the wafer in an oxygen atmosphere under partial vacuum at a temperature of about 200° C.

The second embodiment of the method of the invention includes dipping the wafer in a polar organic solvent taken from the group of solvents consisting of tetrahydrofuran and ether; applying ultrasound to the wafer while in the organic solvent for between about 10 minutes to 40 minutes; stripping any photoresist from the wafer in an oxygen atmosphere under partial vacuum at a temperature of about 200° C.; dipping the wafer in a second organic solvent; applying ultrasound to the wafer for between about 5 minutes to 20 minutes; and drying the wafer in a nitrogen atmosphere.

It is an object of the invention to provide a method of cleaning the platinum chloride-containing dry etching residues from metal oxide pattern wafers.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The method of the invention uses organic solvents for cleaning platinum chloride-containing compounds from wafers. The most effective solvent is tetrahydrofuran, $C_4H_8O$ (THF). After dipping the platinum-etched, contaminated wafers in THF for 12 hours, or dipping contaminated wafers in THF or ether and subjecting the wafers to ultrasound cleaning, scanning electron microscope (SEM) photos of the wafer show clean metal oxide thin film patterns, after the photoresist layer is removed.

Figure 1:
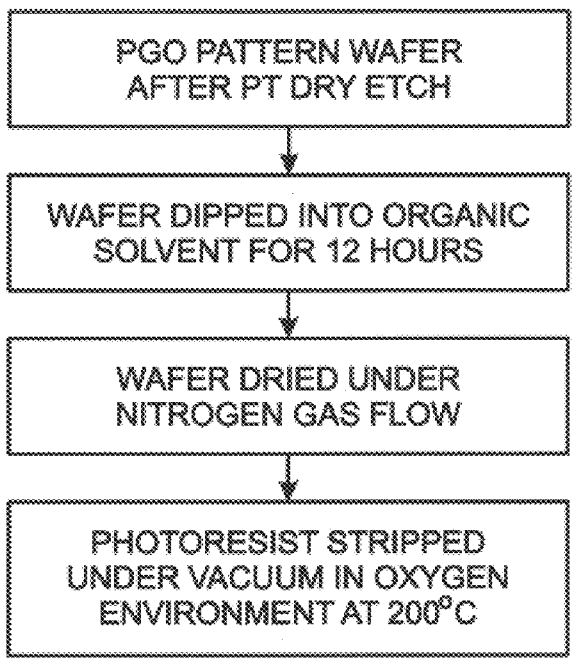
FIG. 1 is a flow chart depicting the first embodiment of the invention.

To validate the method of the invention, experiments were conducted on ferroelectric lead-germanium-oxide ($Pb_5Ge_3O_{11}$) (PGO) patterned wafers. The integrated thin films tested were $Pt/PGO/Pt/Ti/SiO_2/Si$. Photoresist was deposited and patterned on the top platinum electrode. The platinum was etched using chlorine-containing gases. After dry etching, the steps of FIG. 1 were followed for cleaning the wafer.

In the first embodiment of the method of the invention, wafers were experimentally cleaned by dipping in organic solvents, including tetrahydrofuran (THF), acetone, diethyl ether and acetyl acetone. All solvents are used in pure form. After 12 hours, the wafers were removed from the solvents and dried under a pure nitrogen gas flow. Photoresist was removed under partial vacuum in an oxygen atmosphere at 200° C. To determine the results, scanning electron microscope (SEM) photos were taken, as shown in FIGS. 2–5. Clearly, the best result were obtained using THF as the cleaning solvent.

Figure 2:
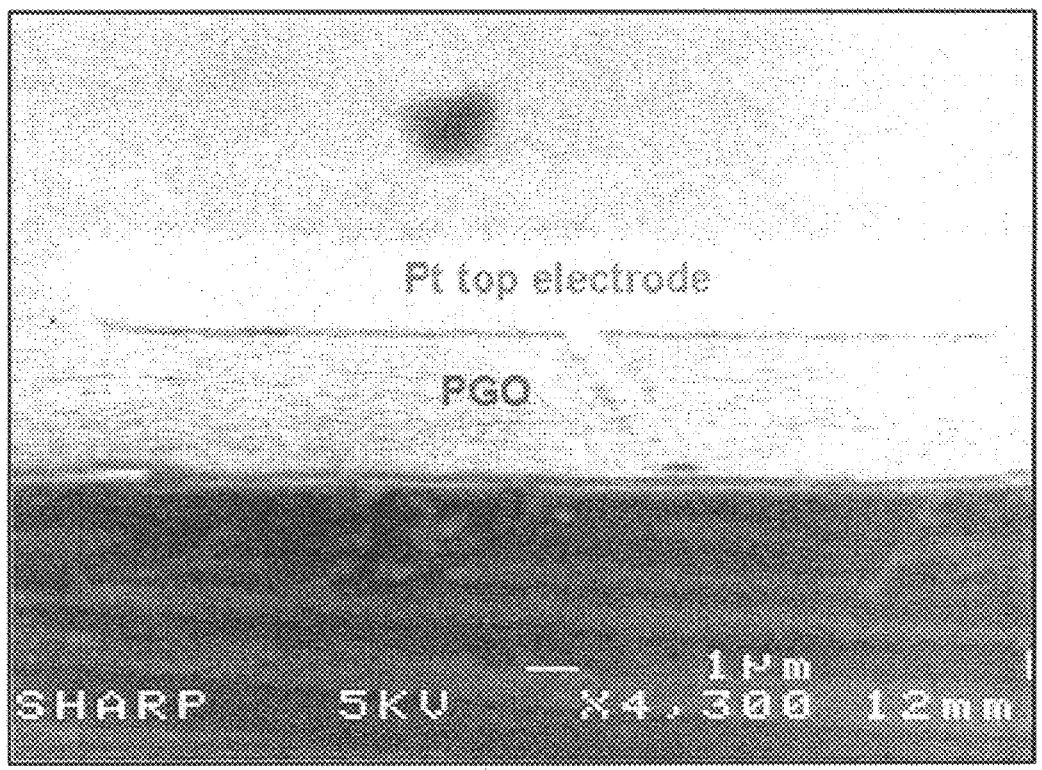
FIGS. 2–5 are SEM photos of PGO patterns cleaned in various organic solvents according to the first embodiment of the method of the invention.
Figure 3:
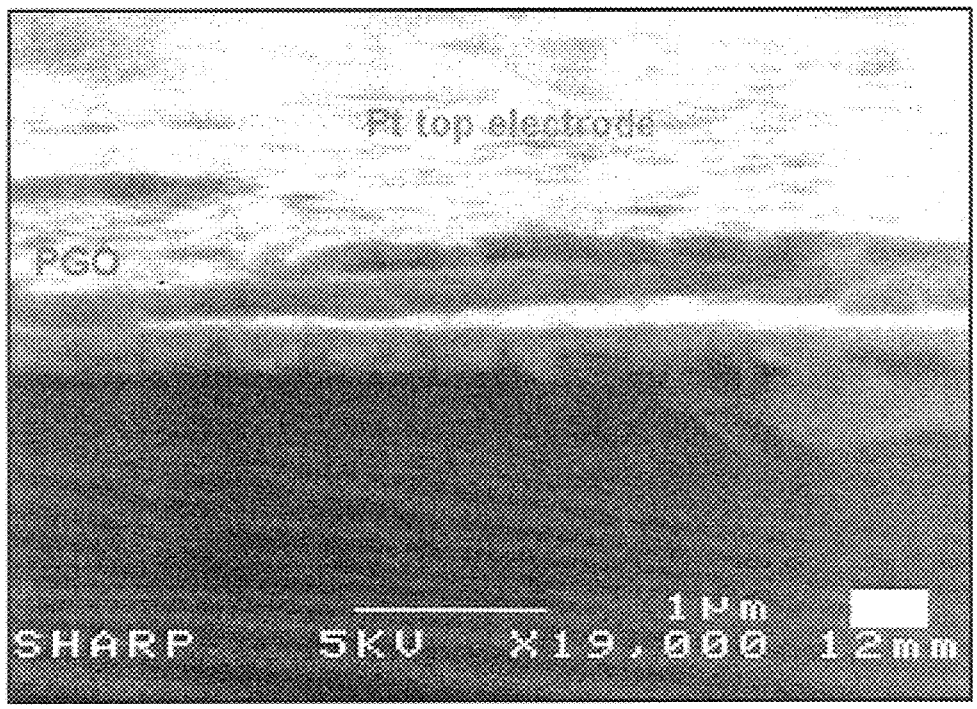
Figure 4:
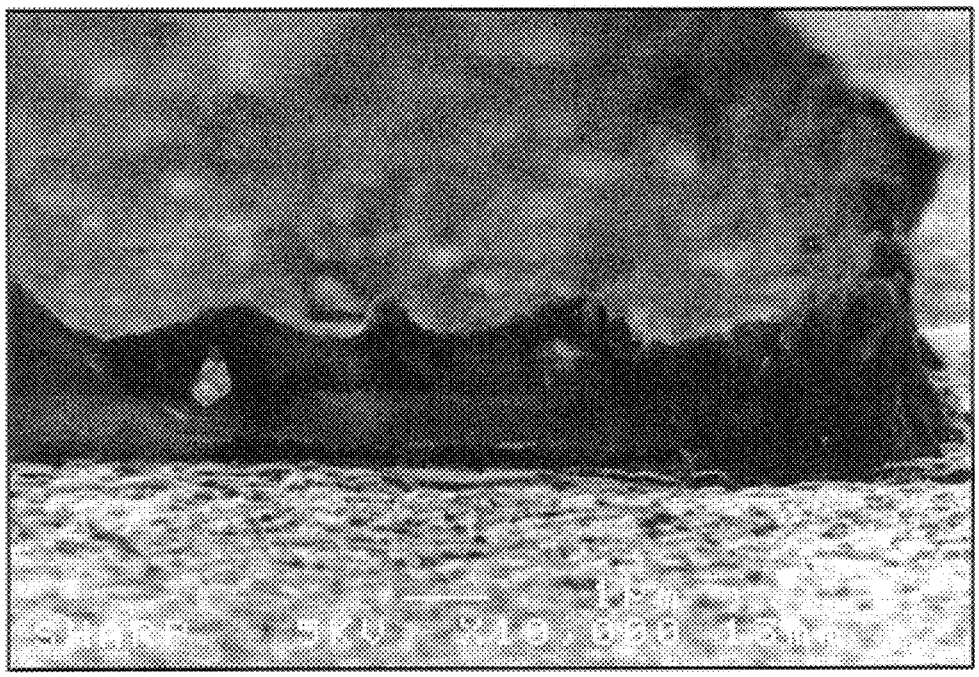
Figure 5:
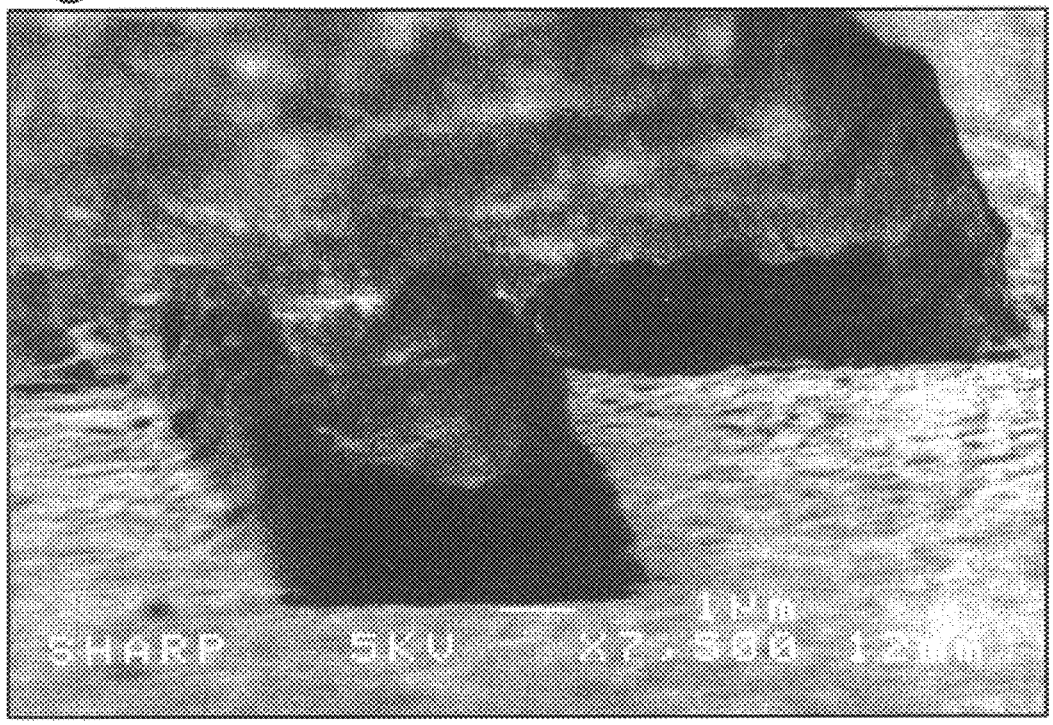

FIGS. 2 and 3, SEM photos of a wafer at ×4300 and ×19,000, respectively, depict the results of cleaning a contaminated wafer in THF. The wafer exhibits a clean surface and clear integration of Pt/PGO/Pt layers. Neither ether, FIG. 4, nor acetone, FIG. 5, are shown to be as effective as THF to provide a clean surface in this embodiment of the method of the invention. The acetyl acetone, FIG. 5, removes the platinum dry residue and also removes the PGO thin films, which is not a desirable result. There was no degradation of ferroelectric properties after the cleaning process of the method of the invention. The memory window was retained and was about the same as before the THF cleaning process. THF appears to be an excellent solvent for metal oxide wafer cleaning applications.

Figure 6:
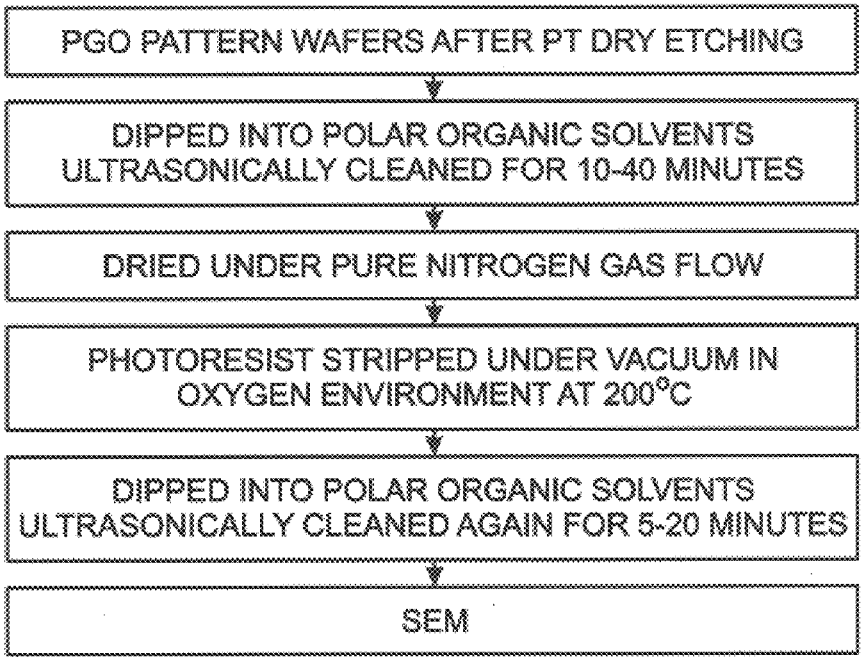
FIG. 6 is a flow chart depicting the second embodiment of the invention.

As in the first embodiment of the method of the invention, the second embodiment of the method of the invention was validated by experiments on ferroelectric PGO patterned wafers. The integrated thin films tested were $Pt/PGO/Pt/Ti/SiO_2/Si$. Photoresist was deposited and patterned on the top platinum electrode. The platinum was etched using chlorine-containing gases. After dry etching, the steps of FIG. 6 were tollowed for cleaning the wafer.

The wafers were experimentally cleaned according to the second embodiment of the method of the invention by dipping in polar organic solvents, such as THF and diethyl ether. The wafers were ultrasonically cleaned for 10–40 minutes while in the solvent and then dried in a pure nitrogen gas flow. The apparatus for this step of the method of the invention includes a water-filled container having ultrasonic transducers mounted on the outer periphery thereof. A second vessel is located in the water bath, which vessel contains the solvent and the wafer to be cleaned.

Photoresist was removed under a partial vacuum in an oxygen atmosphere at 200° C. To remove any possible residue from the photoresist, the wafers were immersed in a polar organic solvent again. and again ultrasonically cleaned while in the solvent for another 5–20 minutes. To determine the results of the solvent and ultrasound cleaning, SEM photos were taken, as shown in FIGS. 7–16.

Figure 7:
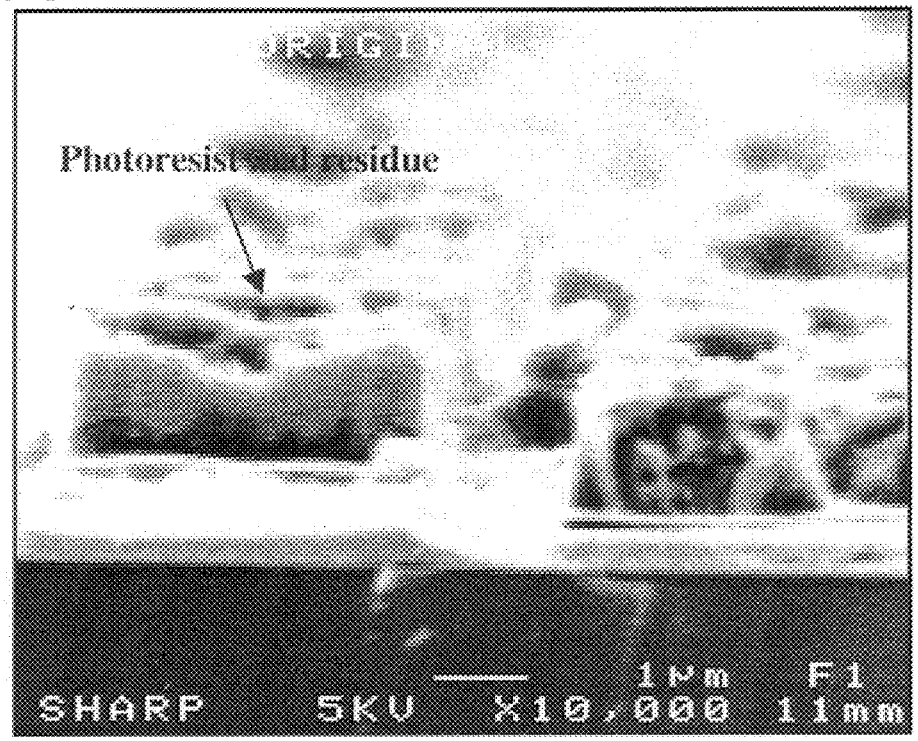
FIGS. 7–16 are SEM photos of PGO patterns cleaned in various organic solvents according to the second embodiment of the method of the invention.
Figure 8:

FIG. 7 is a SEM photo of the original patterned surface after chlorine gas etching of the platinum electrode; while FIG. 8 is a photo of the original patterned surface after photoresist removal. Because the chlorine gas dry etch process does not produce a volatile platinum compound, the etched platinum chloride residue remains on the wafer surface. This type of residue does not have good adhesion to the PGO or platinum surfaces, so it is possible to remove such residues by using a polar organic solvent in conjunction with an ultrasonic cleaning process.

Figure 9:
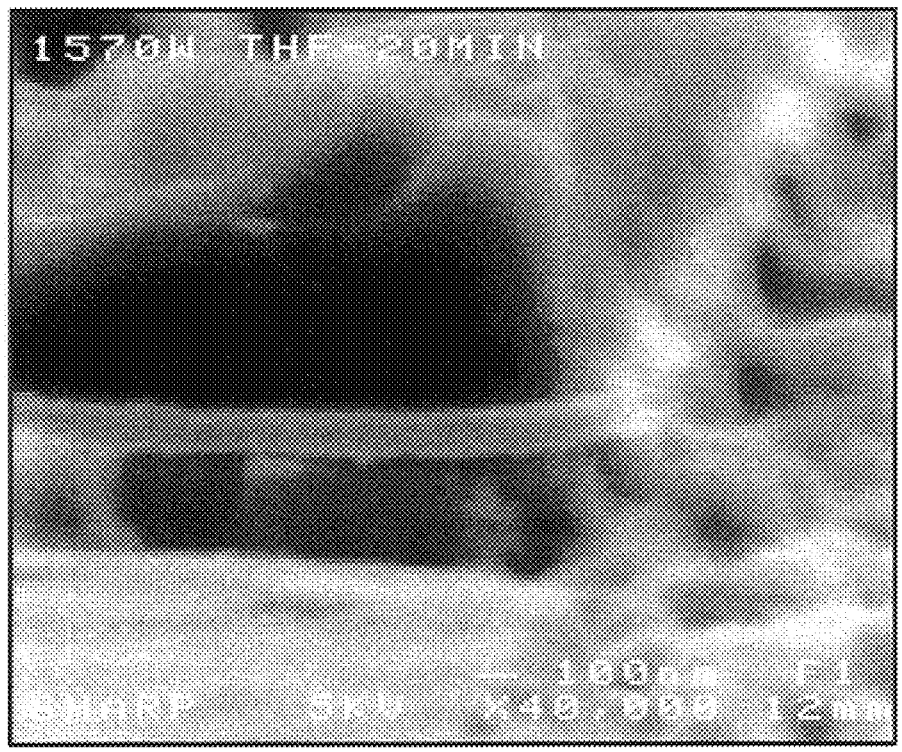
Figure 10:
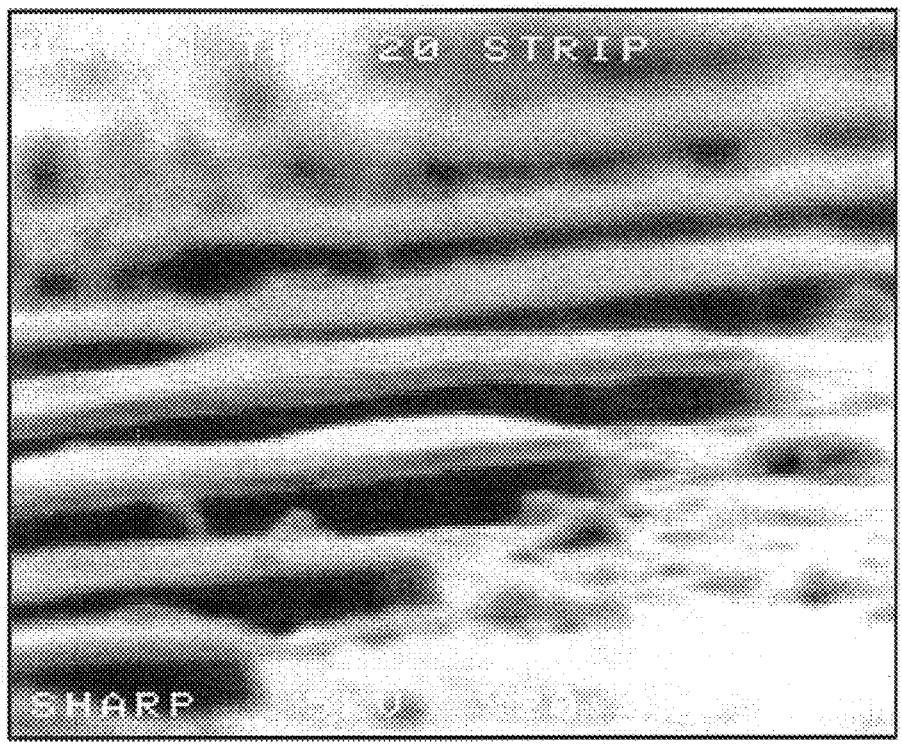
Figure 11:
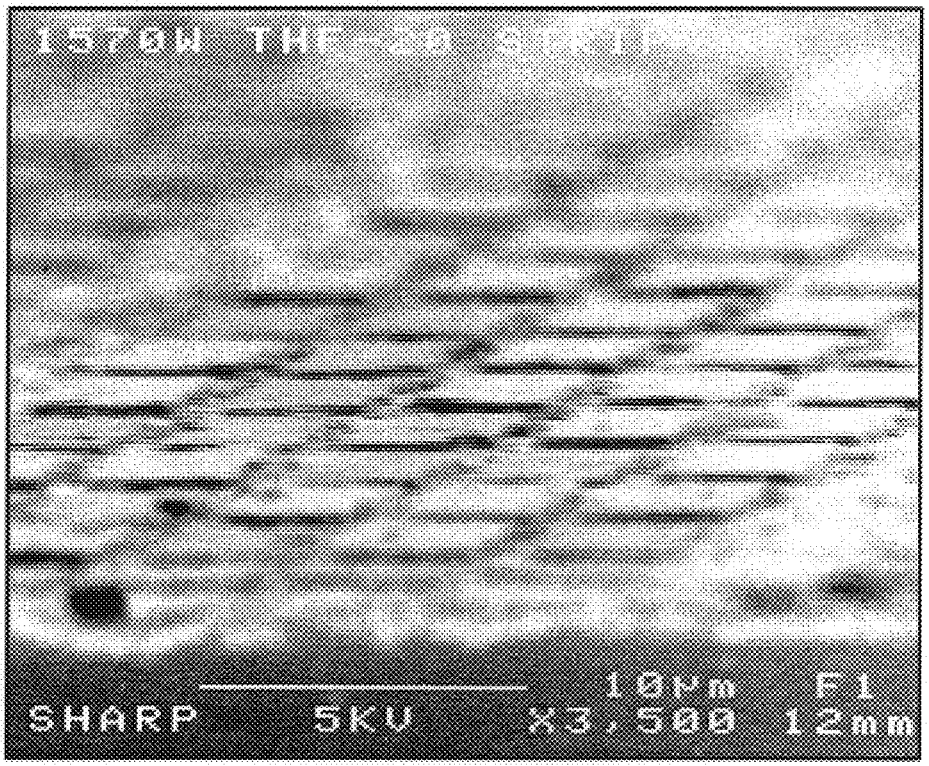
Figure 12:
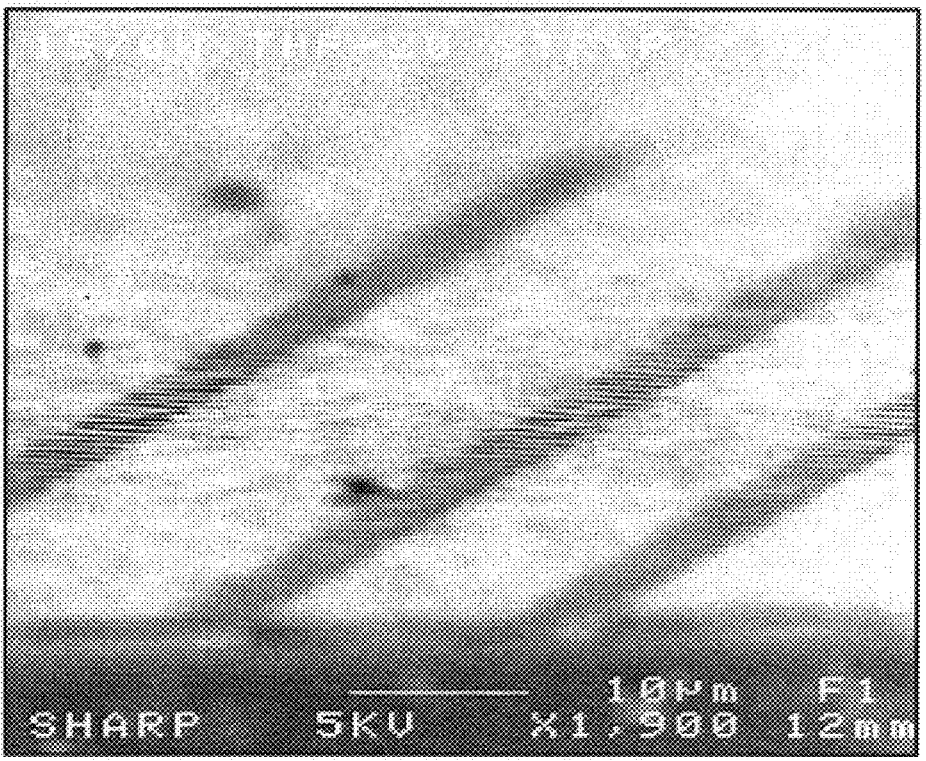
Figure 13:
Figure 14:
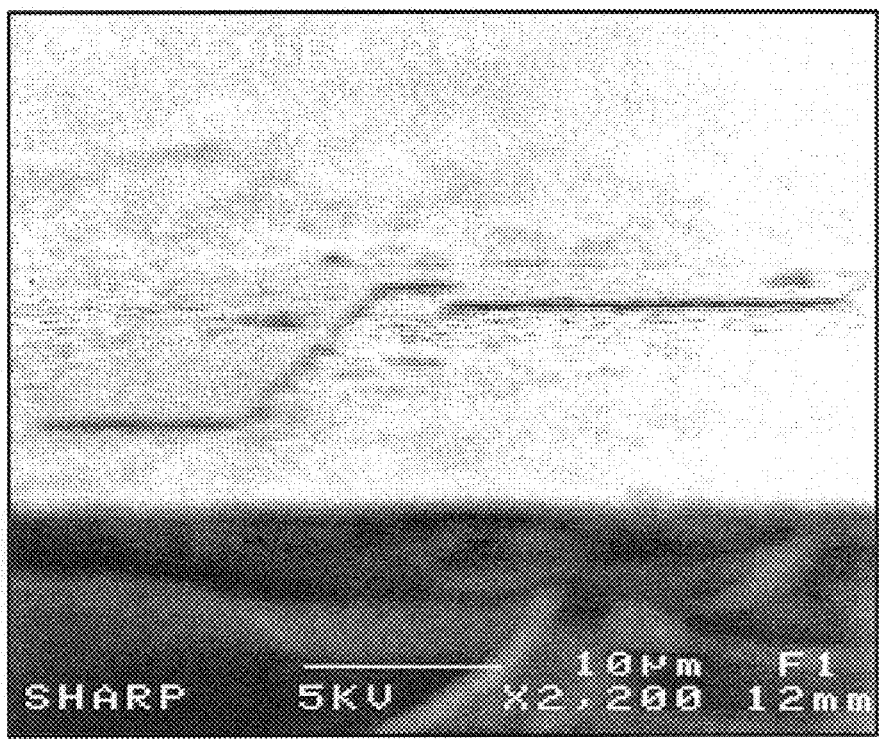
Figure 15:
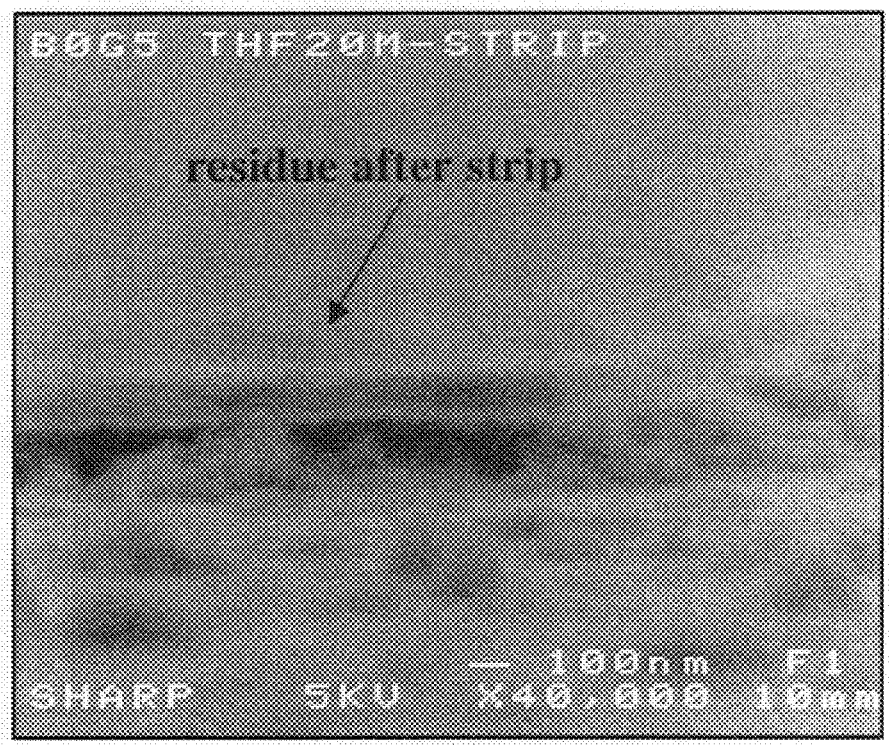
Figure 16:

After platinum chlorine gas dry etching, the wafers are immersed into a polar organic solvent, such as THF or ether, and then subjected to an ultrasonic cleaning process for 10–40 minutes while in the solvent. This process, by itself, does not remove the photoresist, as shown in FIG. 9. The photoresist is removed by conventional techniques in an oxygen atmosphere at 200° C. under a partial vacuum, however. the photoresist removal step does not remove the platinum-chloride etching residue. After the photoresist is removed, as shown in FIG. 10, all of the platinum chloride etching residues were removed, as shown in FIGS. 11 and 12. FIGS. 13 and 14 depict the results of using an ether solvent for the ultrasonic cleaning process. As shown in FIGS. 15 and 16, some residues were still on the patterned surface after the photoresist was removed. Ultrasound was used to clean the wafer once again while immersed in a polar organic solvent, such as THF or ether. The second cleaning process removes all of the platinum chloride etching residues.

In another experiment, the photoresist was initially removed from the original platinum chloride etched wafers, and the wafers then immersed in a polar organic solvent and subjected to ultrasonic cleaning. The results indicated that this procedure removes the platinum top electrode while also cleaning platinum chloride etching residues.

Thus, a method of metal oxide thin film cleaning has been disclosed. It will be appreciated that further variations and modifications thereof may be made within the scope of the invention as defined in the appended claims.

We claim:

1. A method of removing platinum chloride etching residue from a surface of a silicon wafer comprising the sequential steps of:

a) providing a silicon wafer having a surface comprising photoresist and platinum chloride residue deposited thereon;

b) dipping the silicon wafer in a first polar organic solvent selected from the group consisting of tetrahydrofuran and ether; then c) stripping said photoresist from the silicon wafer in an oxygen atmosphere under vacuum at a temperature of about 200° C.; then d) dipping the silicon wafer in a second polar organic solvent to remove any photoresist residue remaining on the surface of the silicon wafer; then e) applying ultrasound to the silicon wafer for between about 5 minutes to 20 minutes; and then f) drying the silicon wafer in a nitrogen atmosphere, wherein steps d) and e) remove said platinum chloride residue from said surface of said silicon wafer.

* * * * *